(12) United States Patent
Kothandaraman et al.

(10) Patent No.: US 11,937,512 B2
(45) Date of Patent: Mar. 19, 2024

(54) MAGNETIC TUNNEL JUNCTION DEVICE WITH AIR GAP

(71) Applicant: INTERNATIONAL BUSINESS MACHINES CORPORATION, Armonk, NY (US)

(72) Inventors: Chandrasekharan Kothandaraman, New York, NY (US); Nathan P. Marchack, New York, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 303 days.

(21) Appl. No.: 17/303,541

(22) Filed: Jun. 2, 2021

(65) Prior Publication Data
US 2022/0393102 A1    Dec. 8, 2022

(51) Int. Cl.
*G11C 11/16* (2006.01)
*H10B 61/00* (2023.01)
(Continued)

(52) U.S. Cl.
CPC ........... *H10N 50/01* (2023.02); *G11C 11/161* (2013.01); *H10B 61/00* (2023.02); *H10N 50/10* (2023.02); *H10N 50/80* (2023.02); *H10N 50/85* (2023.02)

(58) Field of Classification Search
None
See application file for complete search history.

(56) References Cited

U.S. PATENT DOCUMENTS

| 8,975,089 B1 | 3/2015 | Jung |
| 9,142,761 B2 | 9/2015 | Huang |
| (Continued) | | |

FOREIGN PATENT DOCUMENTS

| CN | 101304038 A | 11/2008 |
| CN | 108886092 A | 11/2018 |
| (Continued) | | |

OTHER PUBLICATIONS

Notification of Transmittal of the International Search Report and the Written Opinion of the International Searching Authority, or the Declaration, datetd Jul. 27, 2022, Applicant's or agent's file reference EIE220333PCT, International application No. PCT/CN2022/091542, 9 pages.

*Primary Examiner* — Kevin M Bernatz
(74) *Attorney, Agent, or Firm* — L. Jeffrey Kelly

(57) ABSTRACT

A semiconductor device including a magnetic tunnel junction stack, a metallic hard mask aligned above the magnetic tunnel junction stack and an air gap surrounding the metallic hard mask. A method including forming a magnetic tunnel junction stack, forming a metallic hard mask aligned above the magnetic tunnel junction stack, conformally forming a dielectric over the metallic hard mask and the magnetic tunnel junction stack, forming barrier on vertical side surfaces of the dielectric, and removing the dielectric between the metallic hard mask and the barrier. A method including forming a magnetic tunnel junction stack, forming a metallic hard mask aligned above the magnetic tunnel junction stack, conformally forming a dielectric over the metallic hard mask and the magnetic tunnel junction stack, selectively removing a portion of the dielectric surrounding the metallic hard mark.

16 Claims, 17 Drawing Sheets

(51) Int. Cl.
*H10N 50/01* (2023.01)
*H10N 50/10* (2023.01)
*H10N 50/80* (2023.01)
*H10N 50/85* (2023.01)

(56) References Cited

U.S. PATENT DOCUMENTS

| | | | |
|---|---|---|---|
| 9,324,937 | B1 | 4/2016 | Annunziata |
| 9,553,128 | B1 | 1/2017 | Annunziata |
| 10,056,543 | B2 | 8/2018 | Bak |
| 10,319,783 | B2 | 6/2019 | Briggs |
| 10,347,819 | B2 | 7/2019 | Park |
| 10,497,858 | B1 * | 12/2019 | Ahn ................ H10N 50/01 |
| 10,573,687 | B2 | 2/2020 | Lin |
| 11,676,751 | B2 * | 6/2023 | Tang ................ G01R 33/093 |
| | | | 428/811.5 |
| 2015/0194599 | A1 * | 7/2015 | Park ................ G11C 11/161 |
| | | | 438/3 |
| 2019/0088864 | A1 * | 3/2019 | Cho ................ H10B 61/22 |
| 2019/0131346 | A1 * | 5/2019 | Lin ................ H01L 21/76802 |
| 2020/0106008 | A1 * | 4/2020 | Peng ................ H10B 61/00 |
| 2020/0227471 | A1 | 7/2020 | Chen |
| 2021/0027832 | A1 * | 1/2021 | Wang ................ H10B 12/30 |
| 2022/0036932 | A1 * | 2/2022 | Chuang ................ G11C 5/025 |
| 2022/0359814 | A1 * | 11/2022 | Standaert ................ H10N 50/80 |

FOREIGN PATENT DOCUMENTS

| | | |
|---|---|---|
| CN | 109524542 A | 3/2019 |
| CN | 110061126 A | 7/2019 |
| CN | 110970553 A | 4/2020 |
| WO | 2022252918 A1 | 12/2022 |

* cited by examiner

100

| 106 | 108 | 106 |
|-----|-----|-----|
| 102 | 104 | 102 |

*Figure 1*

MAGNETIC TUNNEL JUNCTION DEVICE WITH AIR GAP

BACKGROUND

The present invention relates, generally, to the field of semiconductor manufacturing, and more particularly to fabricating a magnetic tunnel junction device with an air gap.

Magnetoresistive random-access memory ("MRAM") devices are used as non-volatile computer memory. MRAM data is stored by magnetic storage elements. The elements are formed from two ferromagnetic layers, each of which can hold a magnetic field, separated by a thin insulating layer or tunnel layer. One of the two layers is a reference magnet or a reference layer set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

SUMMARY

According to an embodiment, a semiconductor device is provided. The semiconductor device including a magnetic tunnel junction stack, a metallic hard mask aligned above the magnetic tunnel junction stack and an air gap surrounding the metallic hard mask.

According to an embodiment, a method is provided. The method including forming a magnetic tunnel junction stack, forming a metallic hard mask aligned above the magnetic tunnel junction stack, conformally forming a dielectric over the metallic hard mask and the magnetic tunnel junction stack, forming a barrier on vertical side surfaces of the dielectric, and removing the dielectric between the metallic hard mask and the barrier.

According to an embodiment, a method is provided. The method including forming a magnetic tunnel junction stack, forming a metallic hard mask aligned above the magnetic tunnel junction stack, conformally forming a dielectric over the metallic hard mask and the magnetic tunnel junction stack, selectively removing a portion of the dielectric surrounding the metallic hard mark.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

Figure 1:
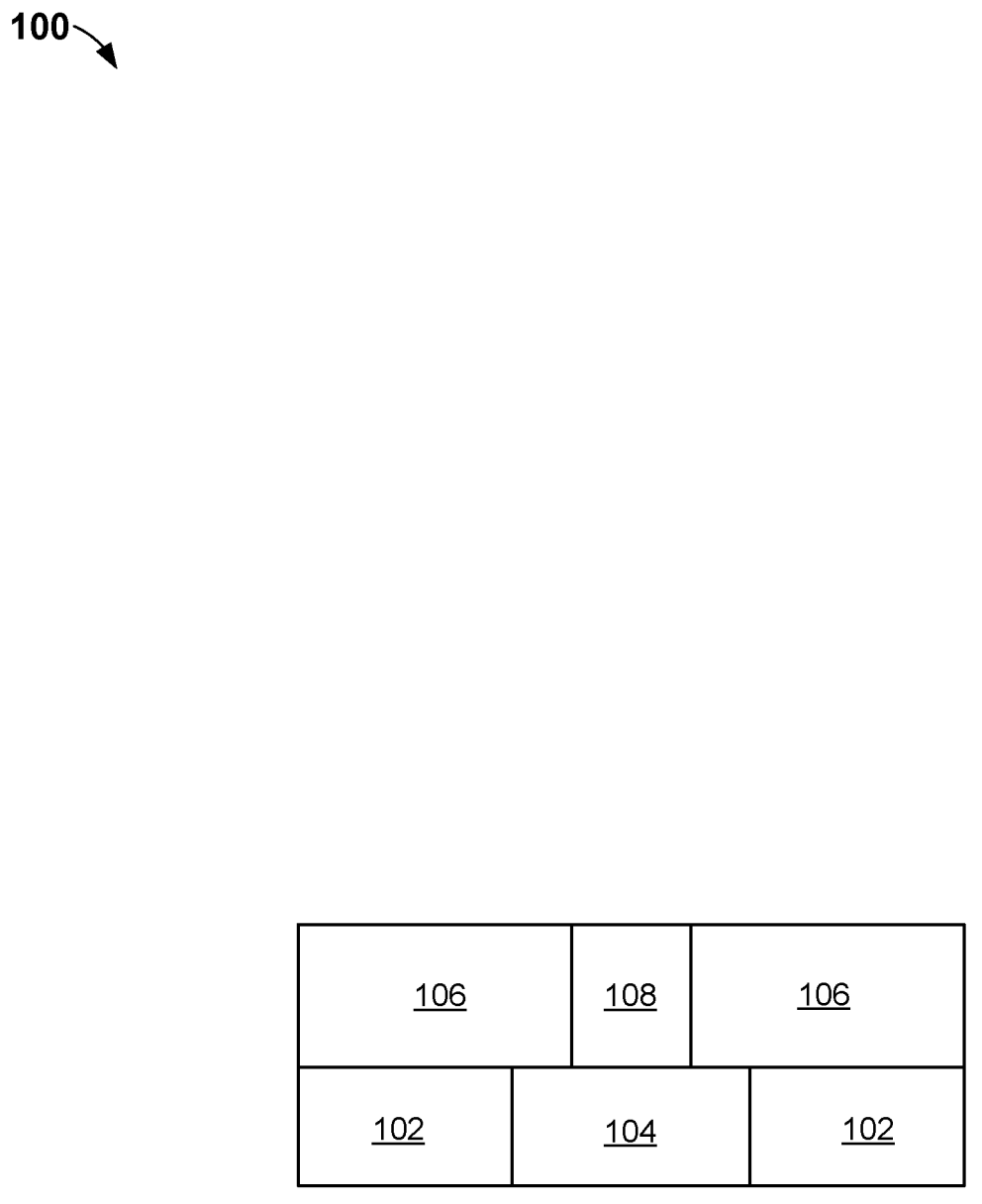

FIG. 1 illustrates a cross-sectional view of a semiconductor structure at an intermediate stage of fabrication, according to an exemplary embodiment;

Figure 2:
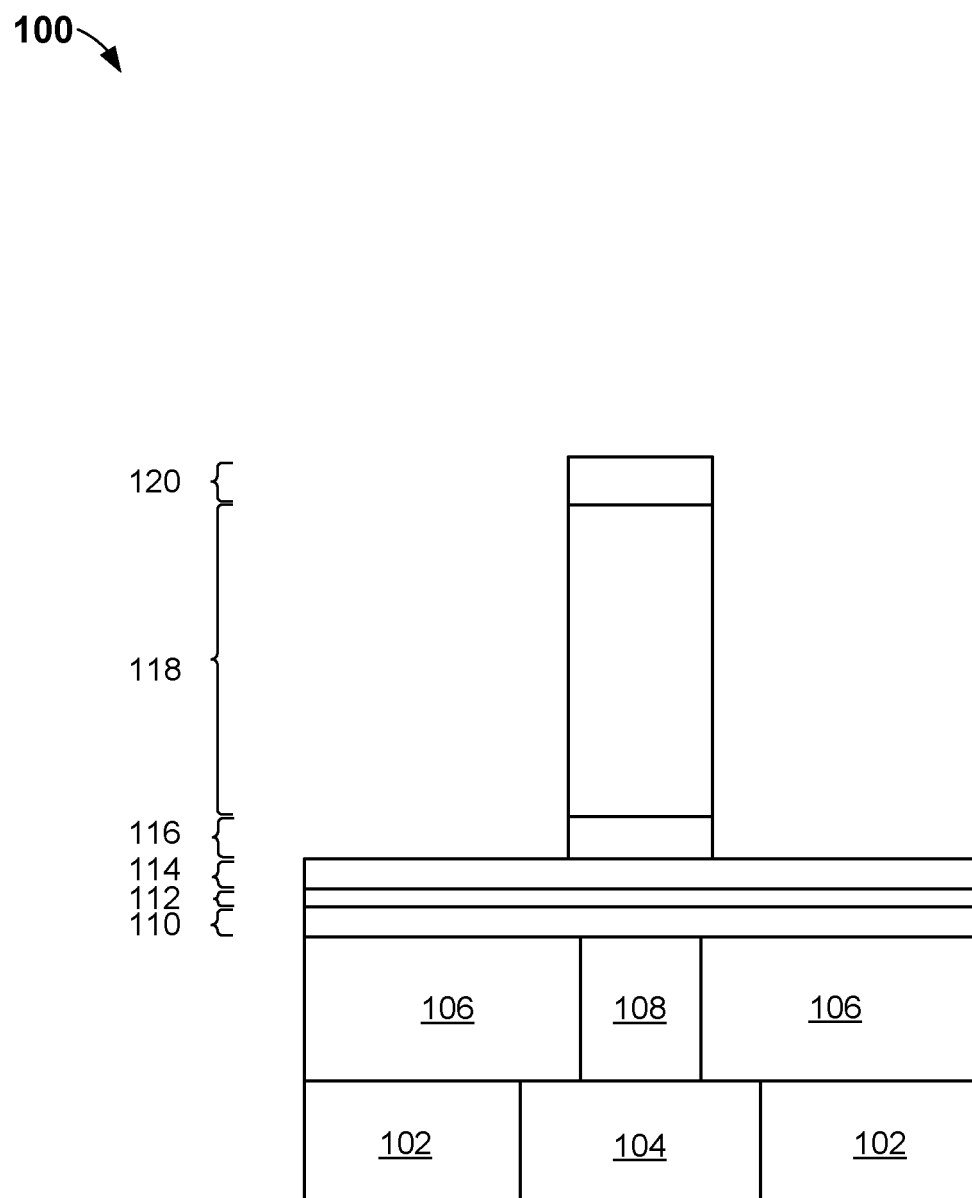
FIG. 2 illustrates fabrication of magnetoresistive random-access memory ("MRAM") stack layers and hard mask deposition, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magnetoresistive random-access memory ("MRAM") devices are a non-volatile computer memory technology. MRAM data is stored by magnetic storage elements. The elements are formed from two ferromagnetic layers, each of which can hold a magnetic field, separated by a thin insulating layer or tunnel layer. One of the two layers is a magnetic reference layer set to a particular polarity, while the remaining layer's field can be changed in at least two different directions, representing different digital states such as 0 and 1 for memory applications. The magnetic reference layer may be referred to as a reference layer, and the remaining layer may be referred to as a free layer. This configuration is known as the magnetic tunnel junction (MTJ) and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher which the magnetizations are anti-parallel and lower when they are parallel, though this can be reversed, depending on materials used in fabrication of the MRAM.

The present application relates to magnetoresistive random access memory (MRAM). More particularly, the present application relates to a modified double magnetic tunnel junction (mDMTJ) structure that can improve the performance of spin-transfer torque (STT) MRAM and which can be integrated into the back-end-of-the-line (BEOL) processing of semiconductor technologies (such as CMOS technologies). One type of MRAM that can use MTJ is spin-transfer torque MRAM (hereinafter "STT-MRAM"). STT MRAM has an advantages of lower power consumption and better scalability over conventional MRAM which uses magnetic fields to flip the active elements. In STT MRAM, spin-transfer torque is used to flip (switch) the orientation of the magnetic free layer. For an STT MRAM device, a current passing through the MTJ structure is used to switch, or "write" the bit-state of the MTJ memory element. A current passing down through the MTJ structure makes the magnetic free layer parallel to the magnetic reference layer, while a current passed up through the MTJ structure makes the magnetic free layer anti-parallel to the magnetic reference layer.

The present invention relates, generally, to the field of semiconductor manufacturing, and more particularly to fabricating a magnetic tunnel junction device with an air gap.

A method and structure to fabricate an improved thermal isolation structure that does not damage the sensitive MTJ dielectric by providing good thermal isolation is provided. Standard BEOL process steps are used to produce uniformly patterned structures.

Advantages of the current invention include consistent formation of the air gap or cavity via patterning, providing increased thermal isolation of the MTJ, reducing impact of dielectric stress on the MTJ for a dielectric surrounding the MTJ and surrounding a metallic hard mask, and an etch stop layer aligned above the MTJ. In an embodiment, the dielectric surrounding the MTJ and layers aligned above the MTJ may include SiN, which has a high silicon to nitrogen ratio, and high thermal conductivity of 10-40 w/m-K. In an embodiment, the air gap surrounding the layers aligned above the MTJ may be surrounded with a barrier material. In an embodiment, the barrier material may include tantalum nitride (TaN), which, particularly in thin-film form, has high thermal conductivity of 2-4 w/m-K, significantly smaller than metals, providing further thermal isolation of the MTJ. For example, ruthenium (Ru) and other metals have higher thermal conductivity, ~100 w/m-K.

In an embodiment, a dielectric such as SiN, may be deposited after MTJ patterning, surrounding the MTJ and layers above the MTJ, such as the metallic hard mask and an etch stop layer. A barrier material, such as TaN, may be formed on the SiN, and patterned such that the barrier material remains on vertical surfaces of the dielectric surrounding the MTJ and the layers above the MTJ. Portions of the dielectric surrounding the MTJ and the layers above the MTJ may be selectively removed leaving a cavity surrounding the MTJ and the layers above the MTJ. An interlayer dielectric ("ILD"), such as tetraethyl orthosilicate, $Si(OC_2H_5)_4$ (TEOS), or SiOx may be formed on the structure such that the ILD fills an minor upper portion of the cavity and a major portion of the cavity remains, providing thermal insulation for the MTJ. Contact formation may continue following standard processes.

Embodiments of the present invention disclose a structure and a method of forming a magnetic tunnel junction device with an air gap are described in detail below by referring to the accompanying drawings in FIGS. 1-17, in accordance with an illustrative embodiment.

Referring now to FIG. 1, a semiconductor structure 100 (hereinafter "structure") at an intermediate stage of fabrication is shown according to an exemplary embodiment. FIG. 1 is a cross-sectional view of the structure 100.

The structure 100 may include several back end of line ("BEOL") layers. In general, the back end of line (BEOL) is the second portion of integrated circuit fabrication where the individual devices (transistors, capacitors, resistors, etc.) are interconnected with wiring on the wafer. As shown in FIG. 1, a first BEOL layer includes a BEOL dielectric layer 102 surrounding a BEOL metal layer 104. A second BEOL layer formed on the first BEOL layer includes via dielectric layer 106 and a via fill layer 108

The BEOL dielectric layer 102 may be formed by conformally depositing or growing a dielectric and performing an isotropic etch process. The BEOL dielectric layer 102 may include one or more layers. The BEOL dielectric layer 102 may be composed of, for example, silicon oxide (SiOx), silicon nitride (SiNx), silicon boron carbonitride (SiBCN), NBLOK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

A first opening (not shown) may be formed in the BEOL dielectric layer 102 by, for example, reactive ion etching (ME), and stopping on a layer below the first BEOL layer for subsequent filling with the BEOL metal layer 104. The BEOL metal layer 104 may be formed within the first opening (not shown) in the BEOL dielectric layer 102, using known techniques. The BEOL metal layer 104 can include, for example, copper (Cu), tantalum nitride (TaN), tantalum (Ta), titanium (Ti), titanium nitride (TiN), or a combination thereof. The BEOL metal layer 104 can be formed by for example, chemical vapor deposition (CVD), physical vapor deposition (PVD), and atomic layer deposition (ALD) or a combination thereof.

A planarization process, such as, for example, chemical mechanical polishing (CMP), may be done to remove excess material from a top surface of the first BEOL layer of the structure 100 prior to forming the second BEOL layer, such that upper horizontal surfaces of the BEOL dielectric layer 102 and the BEOL metal layer 104 are coplanar.

The second BEOL layer is formed on the first BEOL layer. The second BEOL layer includes the via dielectric layer 106 and the via fill layer 108.

The via dielectric layer 106 may be formed by conformally depositing or growing a dielectric and performing an isotropic etch process. The via dielectric layer 106 may include one or more layers. The via dielectric layer 106 is formed above the BEOL dielectric layer 102 and the BEOL metal layer 104. The via dielectric layer 106 may be made of substantially the same material as the BEOL dielectric layer 102.

The via fill layer 108 is then formed within a second opening (not shown) in the via dielectric layer 106. The second opening (not shown) may be formed by, for example, reactive ion etching (ME), and stopping on the BEOL metal layer 104 of the first BEOL layer for subsequent filling with the via fill layer 108. In certain embodiments, the via fill layer 108 may include a material such as tungsten (W), copper (Cu), tantalum nitride (TaN), tantalum (Ta), titanium (Ti), titanium nitride (TiN), titanium oxide carbon nitride (TiOCN), tantalum oxide carbon (TaOCN), cobalt (Co), or a combination of these materials. The via fill layer 108 can be formed by for example, CVD, PVD and ALD or a combination thereof.

In particular, the via fill layer 108 is aligned with the BEOL metal layer 104, providing an electrical connection between the via fill layer 108 and the BEOL metal layer 104.

After the via fill layer 108 is formed, the structure is subjected to, for example, CMP to planarize the surface for further processing, such that upper horizontal surfaces of via dielectric layer 106 and the via fill layer 108 are coplanar. The structure including the BEOL layers shown in FIG. 1 is a starting structure upon which the MTJ stacks are to be formed.

Referring now to FIG. 2, the structure 100 is shown according to an exemplary embodiment. As shown in FIG. 2, magnetoresistive random-access memory ("MRAM") stack layers, an etch stop layer 116, a metallic hard mask 118 and a hard mask layer 120 are formed.

The MRAM stack layers include a first MTJ stack 110, a tunnel layer 112 and a second MTJ stack 114. Each of the MRAM stack layers may be conformally formed on the structure 100 using known techniques. The etch stop layer 116 may be formed on the MRAM stack layers. The metallic hard mask 118 may be formed on the etch stop layer 116. The hard mask layer 120 may be formed on the metallic hard mask 118.

The first MTJ stack 110 and the second MTJ stack 114 may each include a number of layers, including for example, a reference layer, a first tunnel barrier layer, a first free layer, a metal spacer layer, a second free layer, and a second tunnel barrier layer. It should be appreciated that the first MTJ stack 110 and the second MTJ stack 114 may include additional layers, omit certain layers, and each of the layers may include sublayers. Moreover, the composition of layers and/or sublayers may be different between the first MTJ stack 110 and the second MTJ stack 114. In certain embodiments, the first MTJ stack 110 and the second MTJ stack 114 are formed by a self-aligned patterning process. However, in certain examples, the first MTJ stack 110 is not self-aligned with the second MTJ stack 114.

In general, with regard to the first MTJ stack 110 and the second MTJ stack 114, information is stored in the magnetic orientation of a free layer film (described in further detail herein) in relation to that of the reference layer. The reference layer may be a single layer or a plurality of layers. In an embodiment, the reference layer of the MTJ stack is a synthetic antiferromagnetic ("SAF") layer. In certain embodiments, the reference layer of the MTJ stack includes a plurality of sublayers (e.g., twenty or more sublayers).

The first MTJ stack 110 may be referred to as the reference layer and the second MTJ stack 114 may be referred to as the free layer. In an embodiment, the first MTJ stack 110 and the second MTJ stack may each include cobalt (Co), cobalt iron (CoFe), cobalt nickel (CoNi), cobalt iron boron (CoFeB) and cobalt platinum (CoPt), among other materials, in any combination.

The first MTJ stack 110 is separated from the second MTJ stack 114 by the tunnel layer 112. The tunnel layer 112 should be sufficiently thin to allow for electrons to tunnel from one magnetic layer, for example the first MTJ stack 110, to another magnetic layer, for example the second MTJ stack 114. The tunnel layer 112 may include any suitable insulator material in accordance with the embodiments described herein. Examples of suitable insulator materials include, but are not limited to, magnesium oxide (MgO) and aluminum oxide ($Al_2O_3$).

The etch stop layer 116 is deposited on top of the second MTJ stack 114. The etch stop layer 116 can be composed of, for example, ruthenium (Ru). The etch stop layer 214 can be composed of, for example, ruthenium (Ru) and may be deposited utilizing a conventional deposition process such as, for example, CVD, plasma enhanced chemical vapor deposition (PECVD), PVD or ALD.

The metallic hard mask 118 is formed on the etch stop layer 116. The metallic hard mask 118 may be composed of, for example, tungsten (W), tantalum nitrate (TaN) or titanium nitride (TiN). The metallic hard mask 118 may be one or more layers. The metallic hard mask 118 may be deposited utilizing a conventional deposition process such as, for example, CVD, PECVD, PVD or ALD.

The hard mask layer 120 is formed on the metallic hard mask 118. The hard mask layer 120 may be a dielectric and/or organic hard mask layer. The hard mask layer 120 may be composed of, any organic planarization layer material (OPL) or dielectric material, such as, for example, a self-planarizing organic material that includes carbon, hydrogen, oxygen, and optionally nitrogen, fluorine, silicon, a standard CxHy polymer, silicon nitride and/or silicon oxynitride, silicon dioxide or a photoresist. The hard mask layer 120 may be deposited utilizing a conventional deposition process such as, for example, CVD, PECVD, PVD or ALD.

The etch stop layer 116, the metallic hard mask 118 and the hard mask layer 120 may be patterned in one or more steps by lithography and RIE, selectively removing portions of the etch stop layer 116, the metallic hard mask 118 and the hard mask layer 120, such that the second MTJ stack 114 and layers below the second MTJ stack 114 are not etched. Remaining portions of the etch stop layer 116, the metallic hard mask 118 and the hard mask layer 120 may be vertically aligned.

Figure 3:
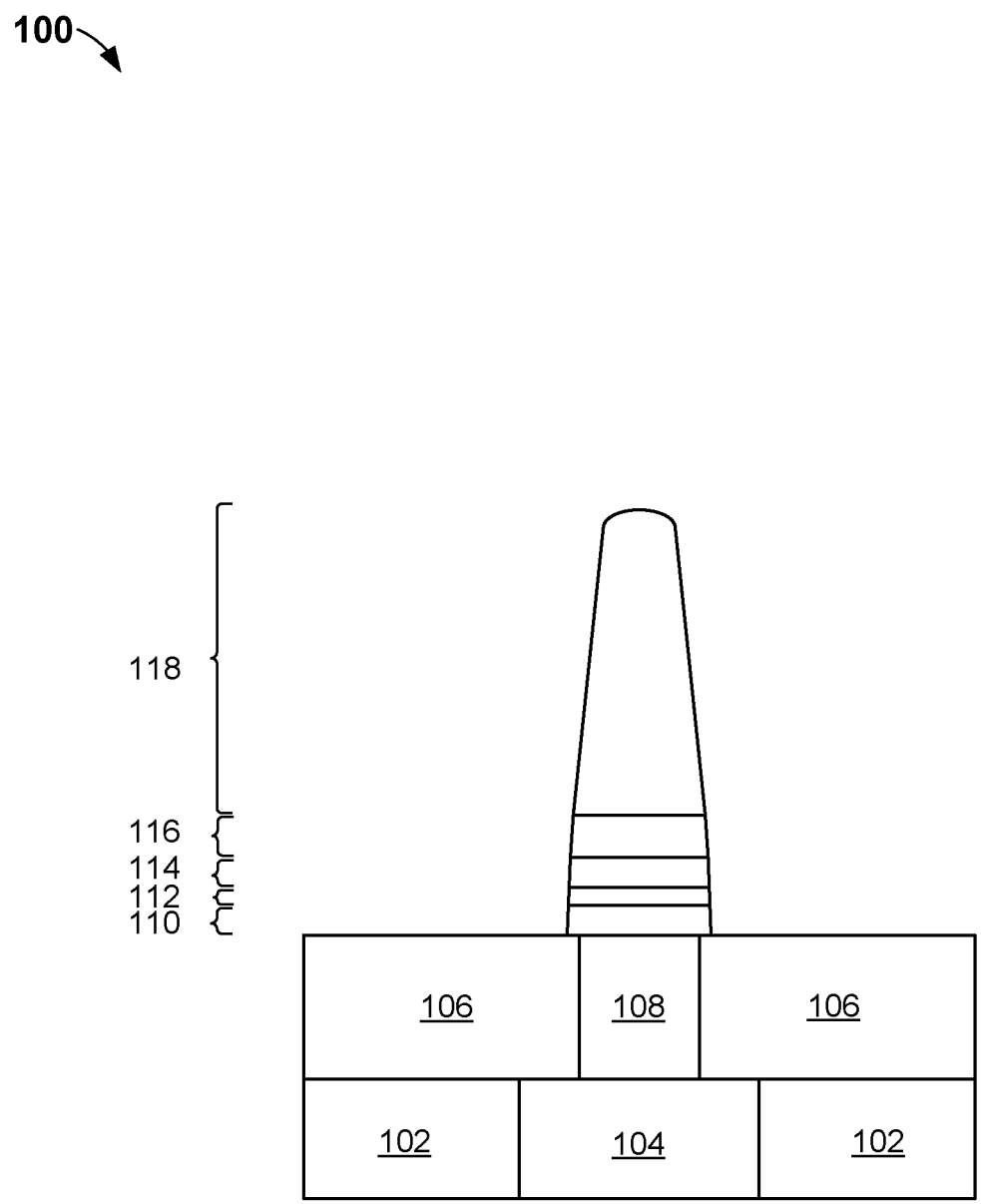
FIG. 3 illustrates forming magnetoresistive random-access memory ("MRAM") stack, according to an exemplary embodiment.

Referring now to FIG. 3, the structure 100 is shown according to an exemplary embodiment. As shown in FIG. 3, the MRAM stack layers are patterned.

The MRAM stack layers, which include the first MTJ stack 110, the tunnel layer 112 and the second MTJ stack 114 are patterned using known techniques, such as for example, ion beam etch (IBE) or RIE. The patterning may be performed in one or more steps. The patterning may remove the hard mask layer 120, and portions of the metallic hard mask 118 and the etch stop layer 116. The resulting structure may include a slightly curved upper surface of the metallic hard mask 118 and include vertically aligned side surfaces of the metallic hard mask 118, the etch stop layer 116, the second MTJ stack 114, the tunnel layer 112 and the first MTJ stack 110. The vertically aligned side surfaces of the metallic hard mask 118, the etch stop layer 116, the second MTJ stack 114, the tunnel layer 112 and the first MTJ stack 110 may have a vertical or nearly vertical profile. The resulting structure has a tapered shape with a fairly consistent slope. Portions of an upper surface of the via dielectric layer 106 may be exposed.

Figure 4:
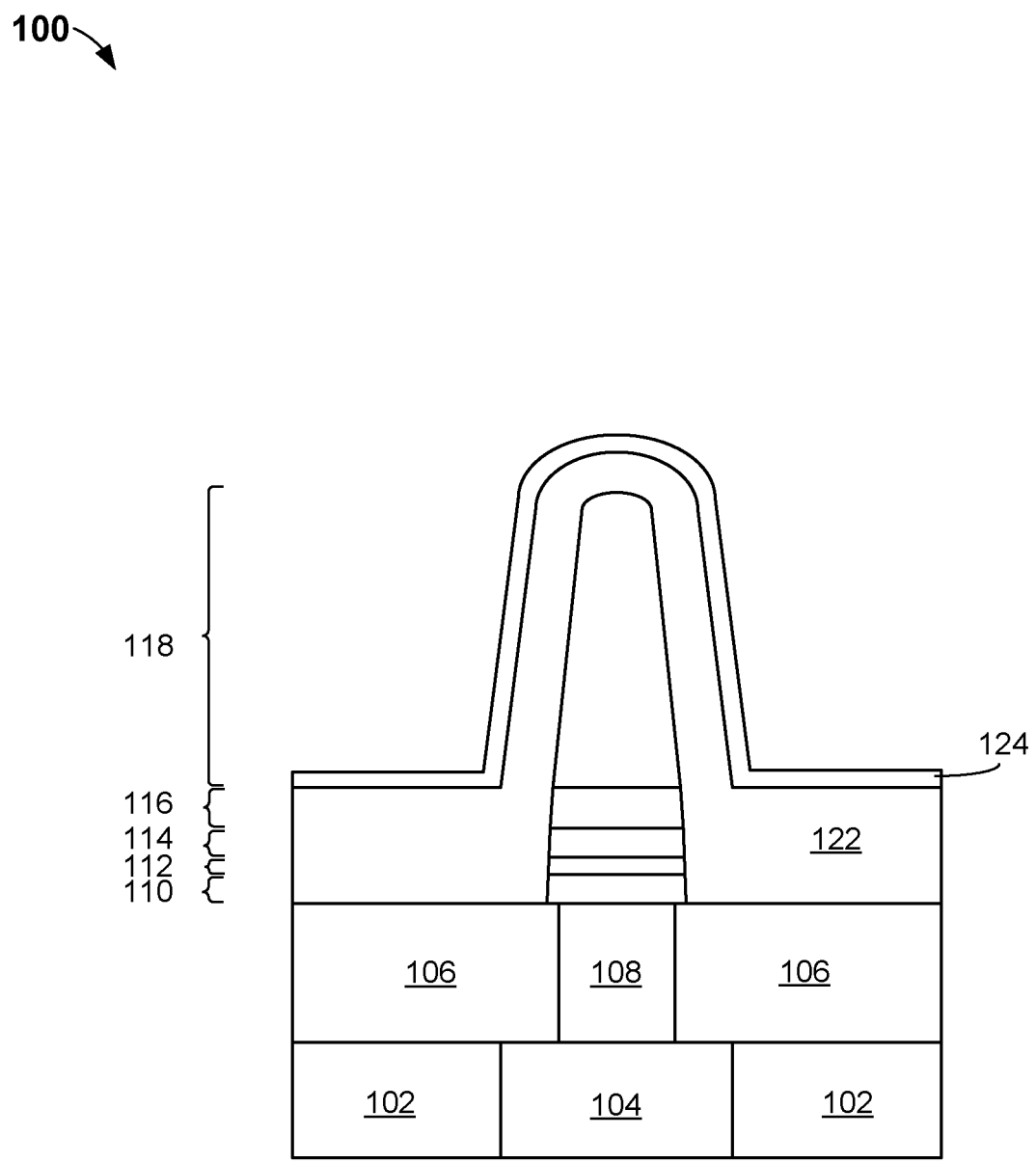
FIG. 4 illustrates forming a dielectric and a hard mask, according to an exemplary embodiment.

Referring now to FIG. 4, the structure 100 is shown according to an exemplary embodiment. As shown in FIG. 4, a sidewall dielectric 122 and a barrier 124 may be formed.

The sidewall dielectric 122 may be conformally formed on an upper surface of the structure 100, on the exposed upper surface of the via dielectric layer 106, on vertical side surfaces of the first MTJ stack 110, the tunnel layer 112, the second MTJ stack 114, the etch stop layer 116 and the metallic hard mask 118, and on the upper surface of the metallic hard mask 118. The sidewall dielectric 122 may be formed by PVD, ALD, PECVD, among other methods. The material of the sidewall dielectric 122 may include silicon nitride (SiN), aluminum oxide (AlOx), titanium oxide (TiOx), silicon oxide (SiOx), boron nitride (BN), SiBCN, silicon boron carbonitride (SiBCN), or any combination thereof.

The barrier 124 may be conformally formed on an upper surface of the structure 100, on an exposed upper surface of the sidewall dielectric 122. The sidewall dielectric 122 may be formed by PVD, ALD, or PECVD, among other methods. The material of the barrier 124 may be tantalum nitride (TaN) or other suitable material.

Figure 5:
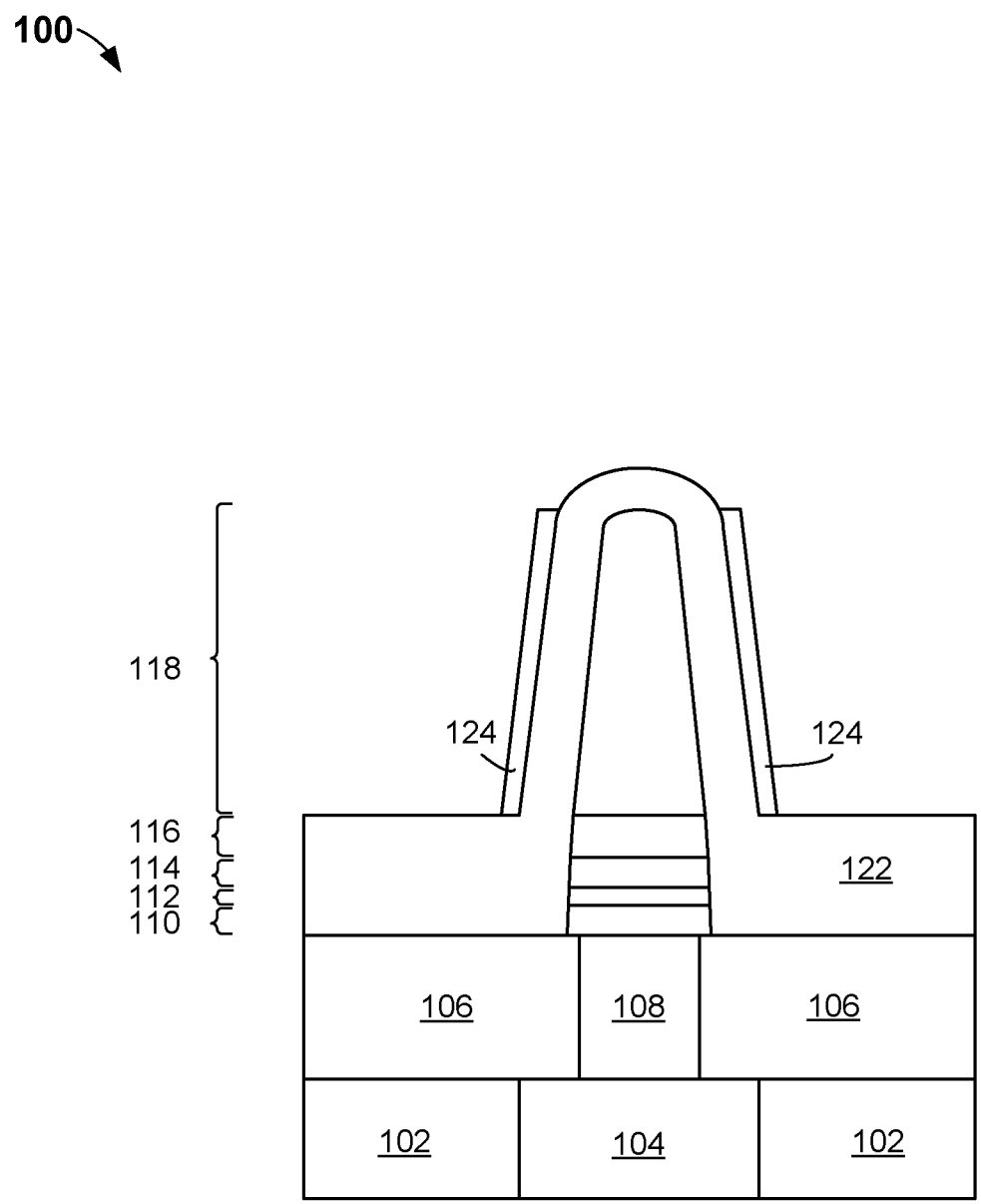
FIG. 5 illustrates selectively removing portions of the hard mask, according to an exemplary embodiment.

Referring now to FIG. 5, the structure 100 is shown according to an exemplary embodiment. As shown in FIG. 5, portions of the barrier 124 may be removed.

Removal of the portions of the barrier 124 may be via IBE or RIE. The barrier 124 may be selectively removed from an upper surface of the sidewall dielectric 122 above the via dielectric layer 106. The barrier 124 may be removed from an upper surface of the sidewall dielectric 122 above the metallic hard mask 118. The barrier 124 may be removed from portions of an upper surface of the sidewall dielectric 122 above the via dielectric layer 106.

The barrier 124 may remain on side surfaces of the sidewall dielectric 122 along side surfaces of the metallic hard mask 118 above the MTJ stack layers. The sidewall dielectric 122 may remain over the upper surface of the via dielectric layer 106, on vertical side surfaces of the first MTJ stack 110, the tunnel layer 112, the second MTJ stack 114, the etch stop layer 116 and the metallic hard mask 118, and on the metallic hard mask 118.

Figure 6:
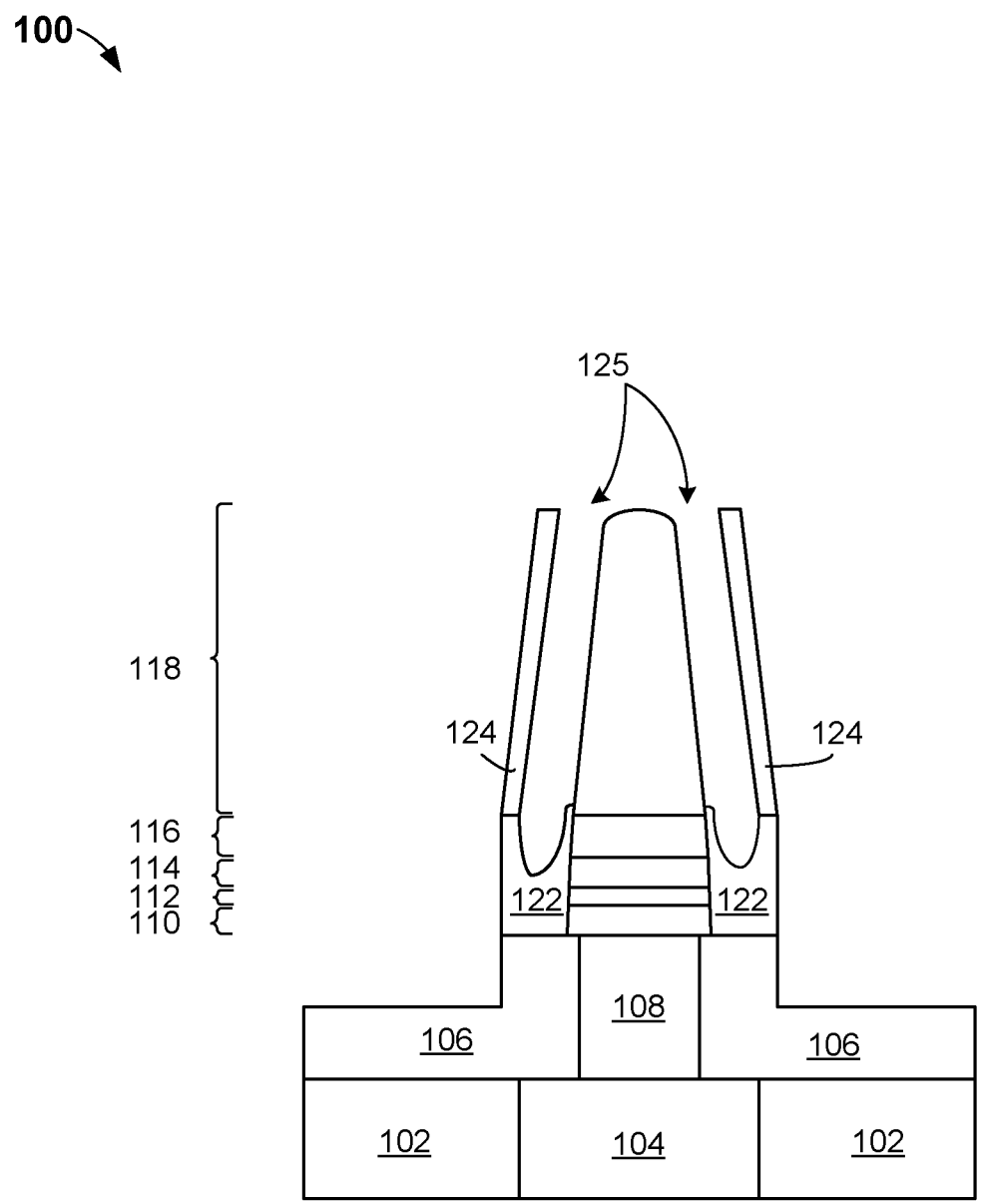
FIG. 6 illustrates selectively removing portions of the dielectric, according to an exemplary embodiment.

Referring now to FIG. 6, the structure 100 is shown according to an exemplary embodiment. As shown in FIG. 6, portions of the via dielectric layer 106 and portions of the sidewall dielectric 122 may be removed, forming a cavity 125.

Removal of the portions of the via dielectric layer 106 and the portions of the sidewall dielectric 122 may be selectively removed via a selective etch process, selective to the barrier 124, the metallic hard mask 118, the etch stop layer 116 and the MTJ stack layers.

A remaining portion of the sidewall dielectric 122 may remain below the barrier 124 and adjacent to the etch stop layer 116 and the MTJ stack layers, above a remaining portion of the via dielectric layer 106. The remaining portion of the sidewall dielectric 122 may be adjacent to a portion of the metallic hard mask 118. In an alternate embodiment, there may be no remaining portion of the sidewall dielectric 122 adjacent to the metallic hard mask 118. The remaining portion of the sidewall dielectric 122 may have a concave upper surface. The cavity 125 may be formed surrounding the metallic hard mask 118, between the metallic hard mask 118 and the barrier 124. The barrier 124 may have an exposed upper surface and exposed interior side surface adjacent to the cavity 125 and exposed exterior side surfaces.

The portions of the via dielectric layer 106 may be removed from exposed upper surfaces of the structure 100. Remaining portions of the via dielectric layer 106 may cover the BEOL dielectric layer 102 and remain surrounding and adjacent to the via fill layer 108, below the remaining portion of the sidewall dielectric 122.

A vertical side surface of the via dielectric layer 106 may be aligned with vertical side surfaces of the remaining sidewall dielectric 122 and the barrier 124.

Figure 7:
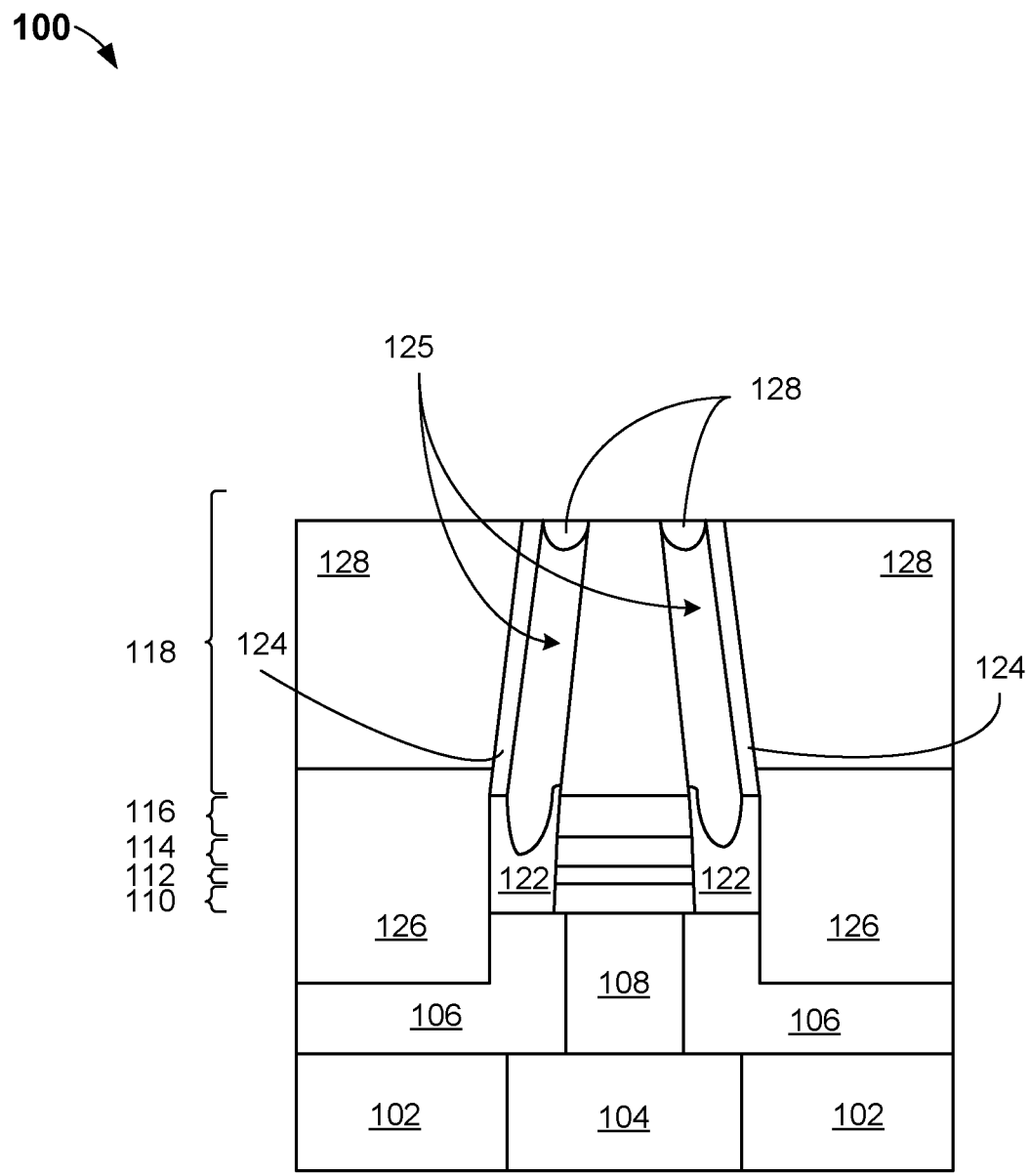
FIGS. 7 and 8 each illustrate forming an interlevel dielectric, according to two exemplary embodiments.
Figure 8:
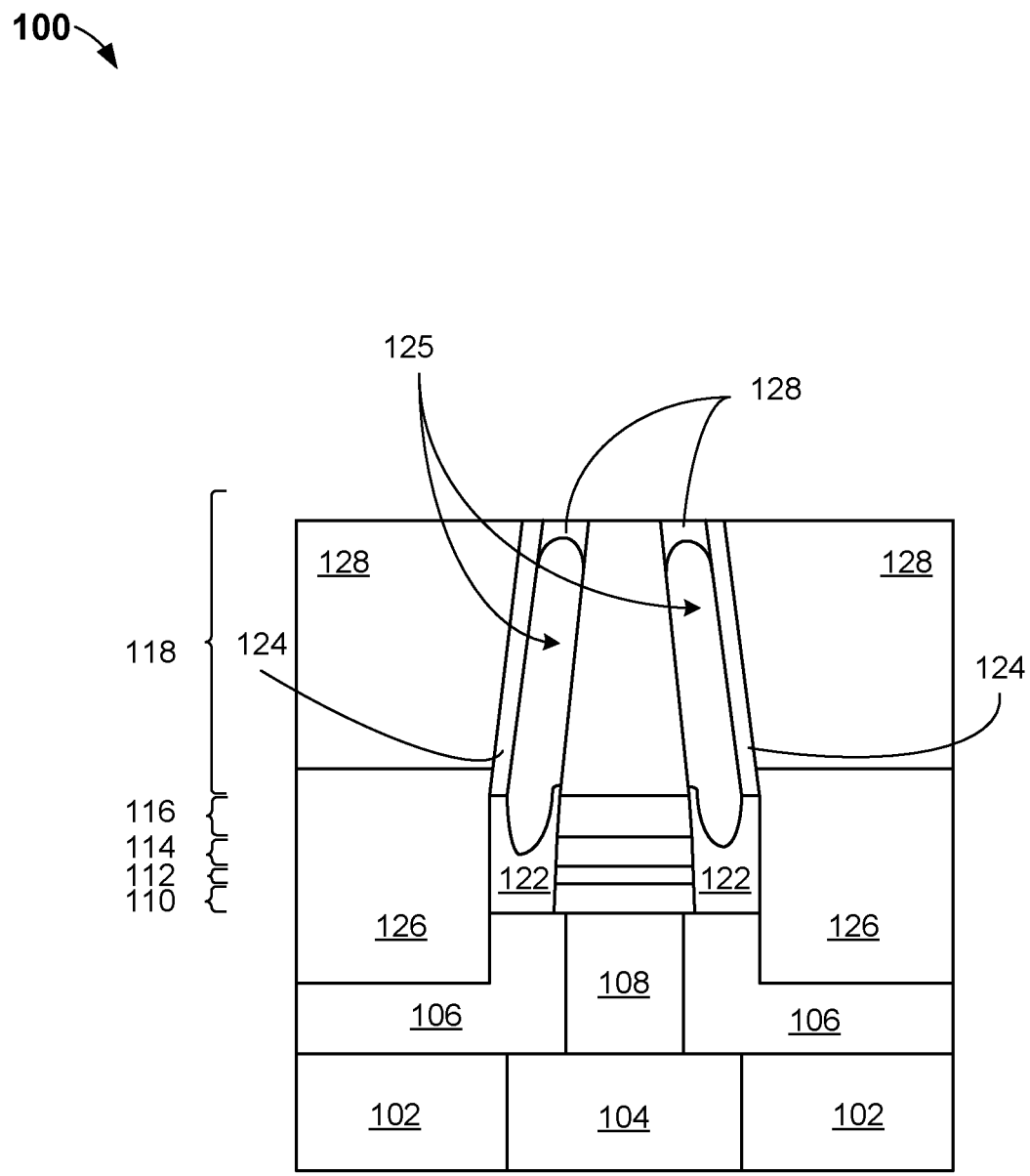

Referring now to FIGS. 7 and 8, the structure 100 is shown according to two exemplary embodiments. As shown in FIGS. 7 and 8, a first interlayer dielectric, (hereinafter "first ILD") 126 and a dielectric 128 may be formed.

The first ILD 126 may be formed via CVD. The first ILD 126 may cover the via dielectric layer 106 over the BEOL dielectric layer 102. Vertical portions of the first ILD 126 may align with vertical sidewalls of the via dielectric layer 106, outer sidewalls of the sidewall dielectric 122 and outer sidewalls of the barrier 124. The first ILD 126 may include one or more layers. The first ILD 126 may be composed of, for example, silicon oxide (SiOx), silicon nitride (SiNx), silicon boron carbonitride (SiBCN), NBLOK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material. Deposition conditions (pressure, flow, temperature, power, etc.) of the first ILD 126 may be adjusted to avoid filling the cavity 125.

The dielectric 128 may partially fill an upper portion of the cavity 125 between the metallic hard mask 118 and the barrier 124. The dielectric 128 may cover the first ILD 126 over the via dielectric layer 106 over the BEOL dielectric layer 102. Vertical portions of the first ILD 126 may align with outer sidewalls of the barrier 124. A majority of the cavity 125 may remain as air and not filled. Deposition conditions (pressure, flow, temperature, power, etc.) of the dielectric 128 may be adjusted to avoid filling the cavity 125 and filling only a portion of the cavity near the entrance of the cavity 125, pinching off the cavity 125.

The dielectric 128 may be formed by PECVD. The dielectric 128 may include one or more layers. The dielectric 128 may be composed of, for example, silicon oxide (SiOx), silicon nitride (SiNx), silicon boron carbonitride (SiBCN), NBLOK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

As shown in FIG. 7, the dielectric 128 at the entrance of the cavity 125 forms a concave surface in an embodiment. As shown in FIG. 8, the dielectric 128 at the entrance of the cavity 125 forms a convex surface in an embodiment. These two different embodiments may be controlled by deposition conditions.

The cavity 125 remains surrounding the metallic hard mask 118. The cavity 125 provides thermal insulation of the MTJ and metallic hard mask 118 and the etch stop layer 116 above the MTJ, from the surrounding dielectric 127 and first ILD 126.

After forming the first ILD 126 and the dielectric 128, a chemical mechanical polishing (CMP) technique may be used to remove excess material and polish upper surfaces of the structure 100 such that upper horizontal surfaces of the dielectric 128, the metallic hard mask 118 and the barrier 124 are coplanar.

Figure 9:
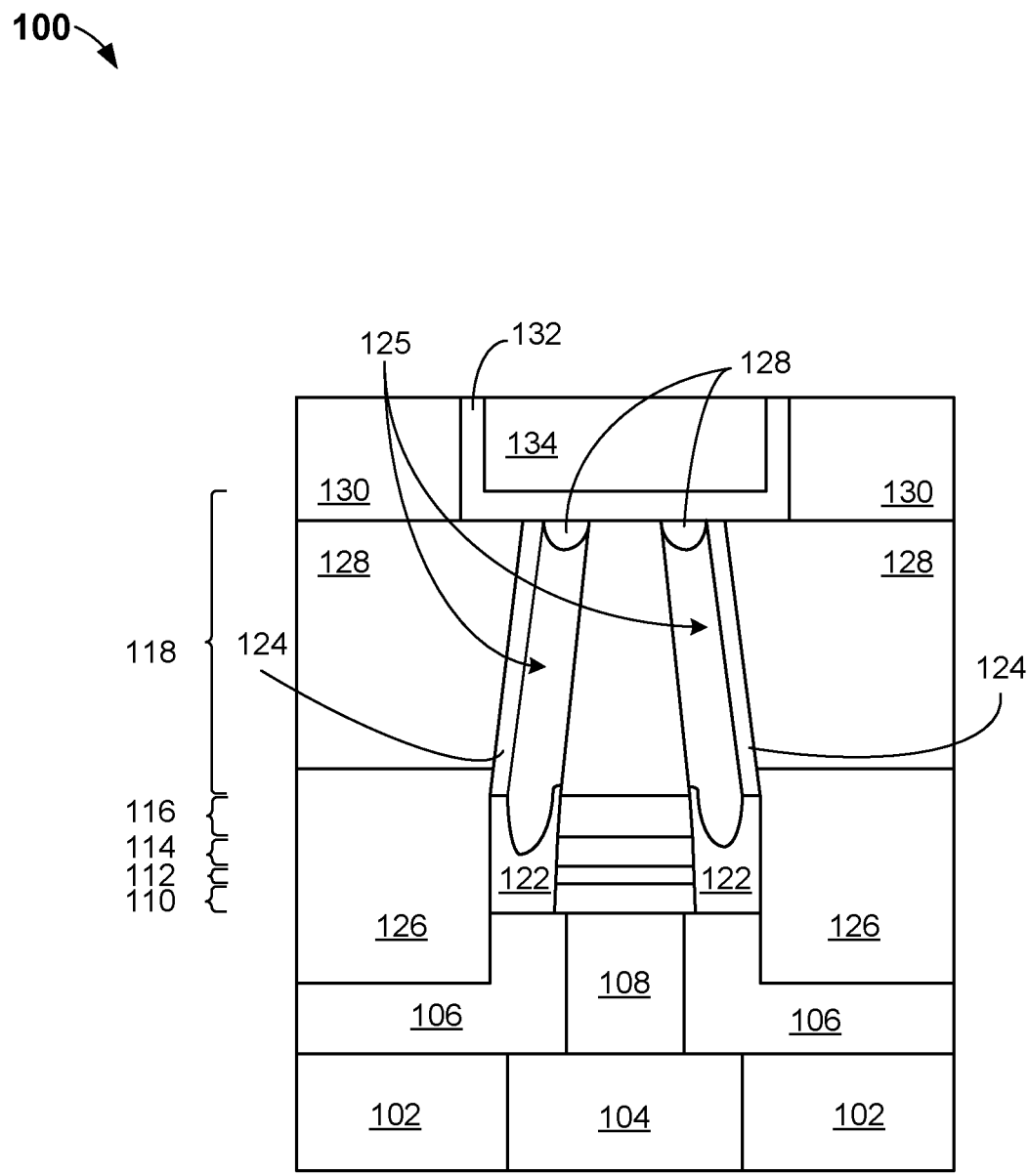
FIGS. 9 and 10 each illustrate forming a bit line, according to two exemplary embodiments.
Figure 10:
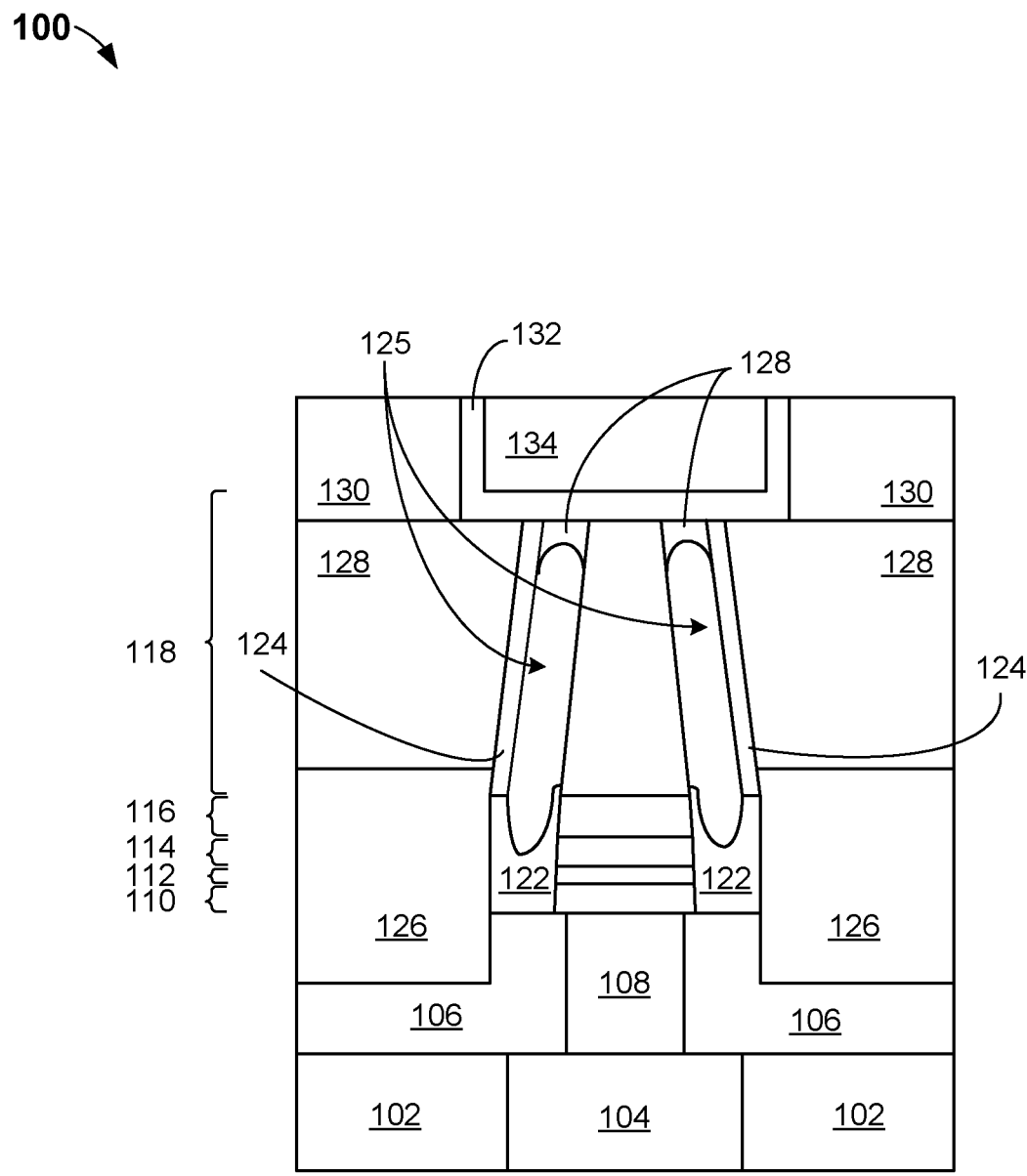

Referring now to FIGS. 9 and 10, the structure 100 is shown according to two exemplary embodiments. As shown in FIGS. 9 and 10, a second interlayer dielectric, (hereinafter "second ILD") 130, a liner 132 and a bit-line metal 134 may be formed. FIG. 9 may formed from FIG. 7, and FIG. 10 may be formed from FIG. 8.

The second ILD 130 may be conformally formed on an upper surface of the structure 100, covering the dielectric 128, the barrier 124 and the metallic hard mask 118.

The second ILD 130 may be formed by conformally depositing or growing a dielectric and performing an isotropic etch process. The second ILD 130 may include one or more layers. The second ILD 130 may be composed of, for example, silicon oxide (SiOx), silicon nitride (SiNx), silicon boron carbonitride (SiBCN), NBLOK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

A third opening (not shown) may be formed in the second ILD 130. The third opening (not shown) may align vertically with the MTJ stack. The third opening (not shown) may be formed via an etch selective to the first ILD 126, the barrier 124 and the metallic hard mask 118.

The liner 132 may be formed along a lower surface and along vertical side surfaces of the third opening (not shown). The liner 132 may be formed after several processes, including for example, conformally depositing or growing a dielectric and performing an isotropic etch process. The liner 132 may include any dielectric material such as silicon nitride and may include a single layer or may include multiple layers of dielectric material.

The bit-line metal 134 may be deposited in a remaining portion of the third opening (not shown) using typical deposition techniques, for example, ALD, MLD and CVD. Materials for the bit-line metal 134 may include, but are not limited to, copper (Cu), tantalum nitride (TaN), tantalum (Ta), titanium (Ti), titanium nitride (TiN), or a combination thereof.

After forming the bit-line metal 134, a chemical mechanical polishing (CMP) technique may be used to remove excess material and polish upper surfaces of the structure 100 such that upper horizontal surfaces of the second ILD 130, the liner 132 and the bit-line metal 134 are coplanar.

The resulting structure 100 contains an air gap, the cavity 125, surrounding the metallic hard mask 118 adjacent to and/or above the MTC stack layers.

Figure 11:
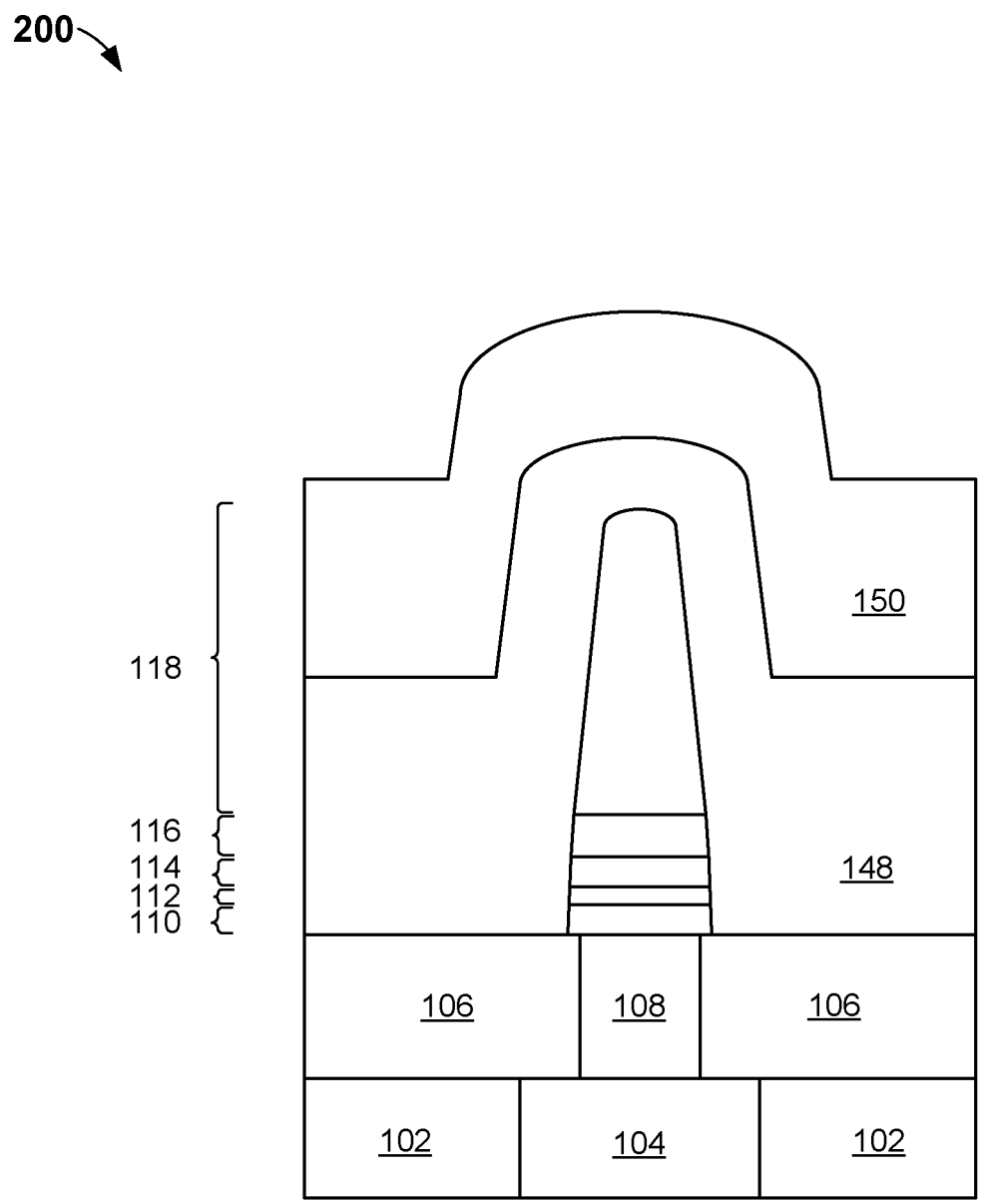
FIG. 11 illustrates an alternate embodiment, according to an exemplary embodiment.

Referring now to FIG. 11, the structure 200 is shown according to an exemplary embodiment. The structure 200 is an alternate embodiment of forming an air gap or cavity surrounding the metallic hard mask 118 above the MTC stack layers. The structure 200 may be formed from subsequent processing of the structure 100 as described above in FIG. 3. As shown in FIG. 11, a second sidewall dielectric 148 and an insulator 150 may be formed.

The second sidewall dielectric 148 may be conformally formed on an upper surface of the structure 200, on the exposed upper surface of the via dielectric layer 106, on vertical side surfaces of the first MTJ stack 110, the tunnel layer 112, the second MTJ stack 114, the etch stop layer 116 and the metallic hard mask 118, and on the upper surface of the metallic hard mask 118. The second sidewall dielectric 148 may be formed by PVD, ALD, PECVD, ALD, PECVD, among other methods. The material of the second sidewall dielectric 148 may include silicon nitride (SiN), aluminum oxide (AlOx), titanium oxide (TiOx), silicon oxide (SiOx), boron nitride (BN), SiBCN, silicon boron carbonitride (SiBCN), or any combination thereof.

The insulator 150 may be formed by conformally depositing or growing a dielectric on exposed surfaces of the second sidewall dielectric 148. The insulator 150 may include one or more layers. The insulator 150 may be composed of, for example, tetraethyl orthosilicate (TEOS), silicon oxide (SiOx), silicon nitride (SiNx), silicon boron carbonitride (SiBCN), NBLOK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

Figure 12:
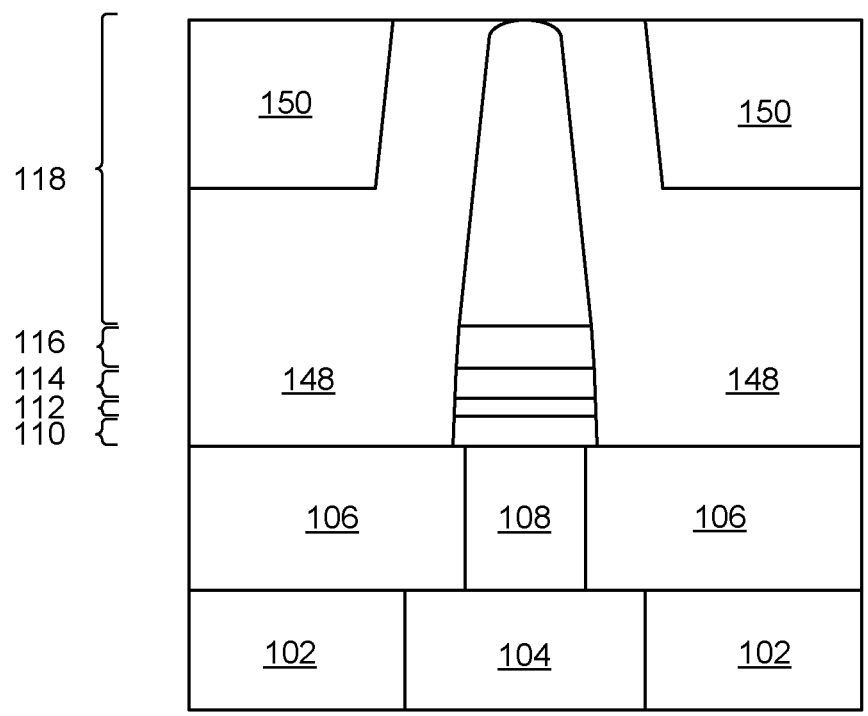
FIG. 12 illustrates forming a dielectric, according to an exemplary embodiment.

Referring now to FIG. 12, the structure 200 is shown according to an exemplary embodiment. As shown in FIG. 12, a CMP technique may be used on the structure 200.

The CMP technique may be used to remove excess material and polish upper surfaces of the structure 200 such that upper horizontal surfaces of the insulator 150, the second sidewall dielectric 148 and the metallic hard mask 118 are coplanar.

Figure 13:
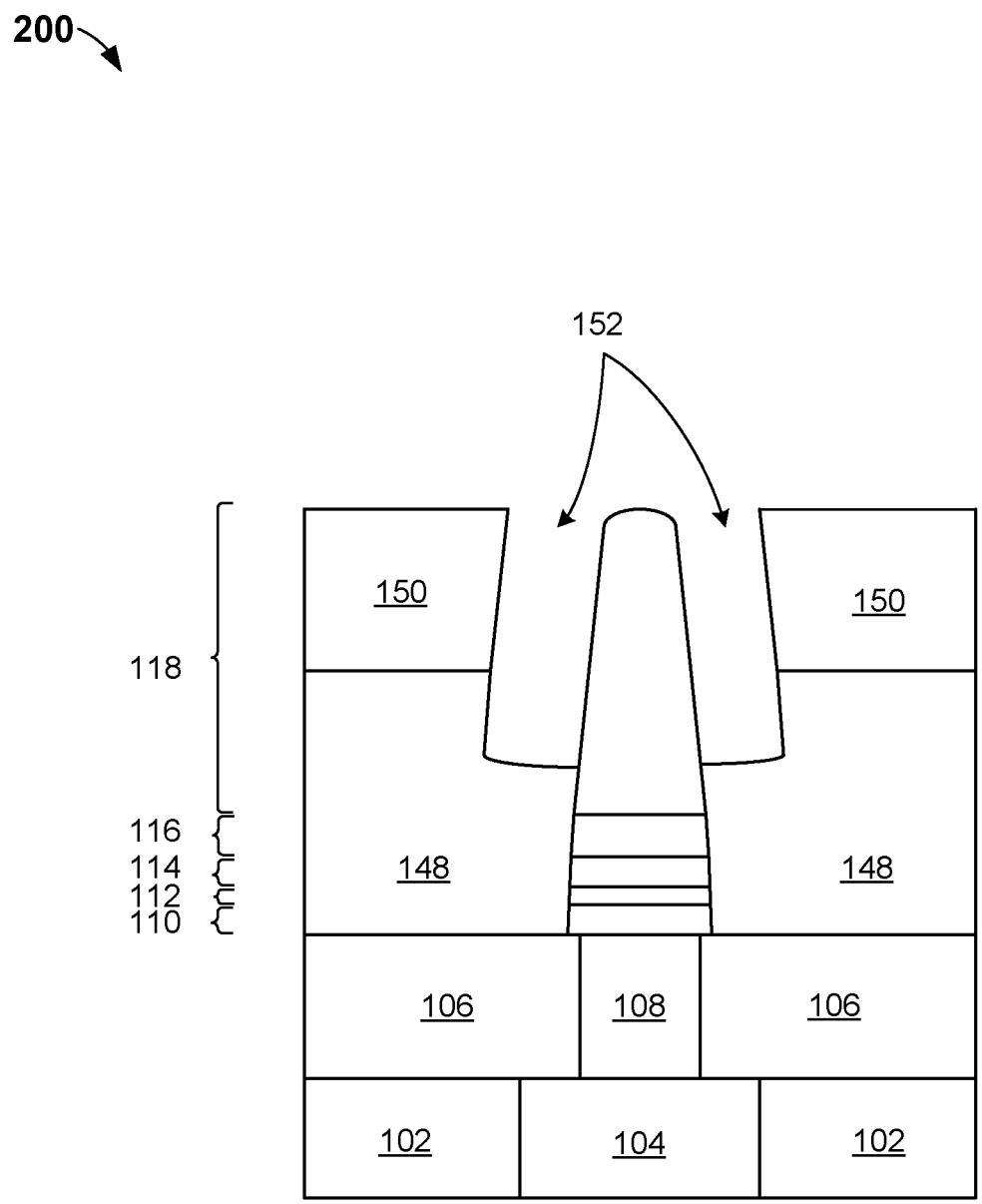
FIG. 13 illustrates selectively removing portions of the dielectric, according to an exemplary embodiment.

Referring now to FIG. 13, the structure 200 is shown according to an exemplary embodiment. As shown in FIG. 13, portions of the insulator 150 and portions of the second sidewall dielectric 148 may be removed, forming a cavity 152.

Removal of the portions of the insulator 150 and the portions of second sidewall dielectric 148 may be selectively removed selective to the metallic hard mask 118, the etch stop layer 116 and the MTJ stack layers, and may be removed via a selective etch process.

A remaining portion of the second sidewall dielectric 148 may remain adjacent to a portion of the metallic hard mask 118, the etch stop layer 116 and the MTJ stack layers, above the via dielectric layer 106. In an alternate embodiment, the remaining portion of the sidewall dielectric 122 may not remain adjacent to the metallic hard mask 118. The remaining portion of the sidewall dielectric 122 may have a concave upper surface adjacent to the metallic hard mask 118 and the MTJ stack layers at a lower surface of the cavity 152.

A remaining portion of the insulator 150 may be above and vertically aligned with a side surface of the second sidewall dielectric 148. The insulator 150 and the second sidewall dielectric 148 may have exposed vertical side surfaces which are vertical or nearly vertical adjacent to the cavity 152.

The cavity 152 may be surround the metallic hard mask 118, between the metallic hard mask 118 and the insulator 150 and between the metallic hard mask and the second sidewall dielectric 148. A lower surface of the cavity 152 may be adjacent to the second sidewall dielectric 148.

Figure 14:
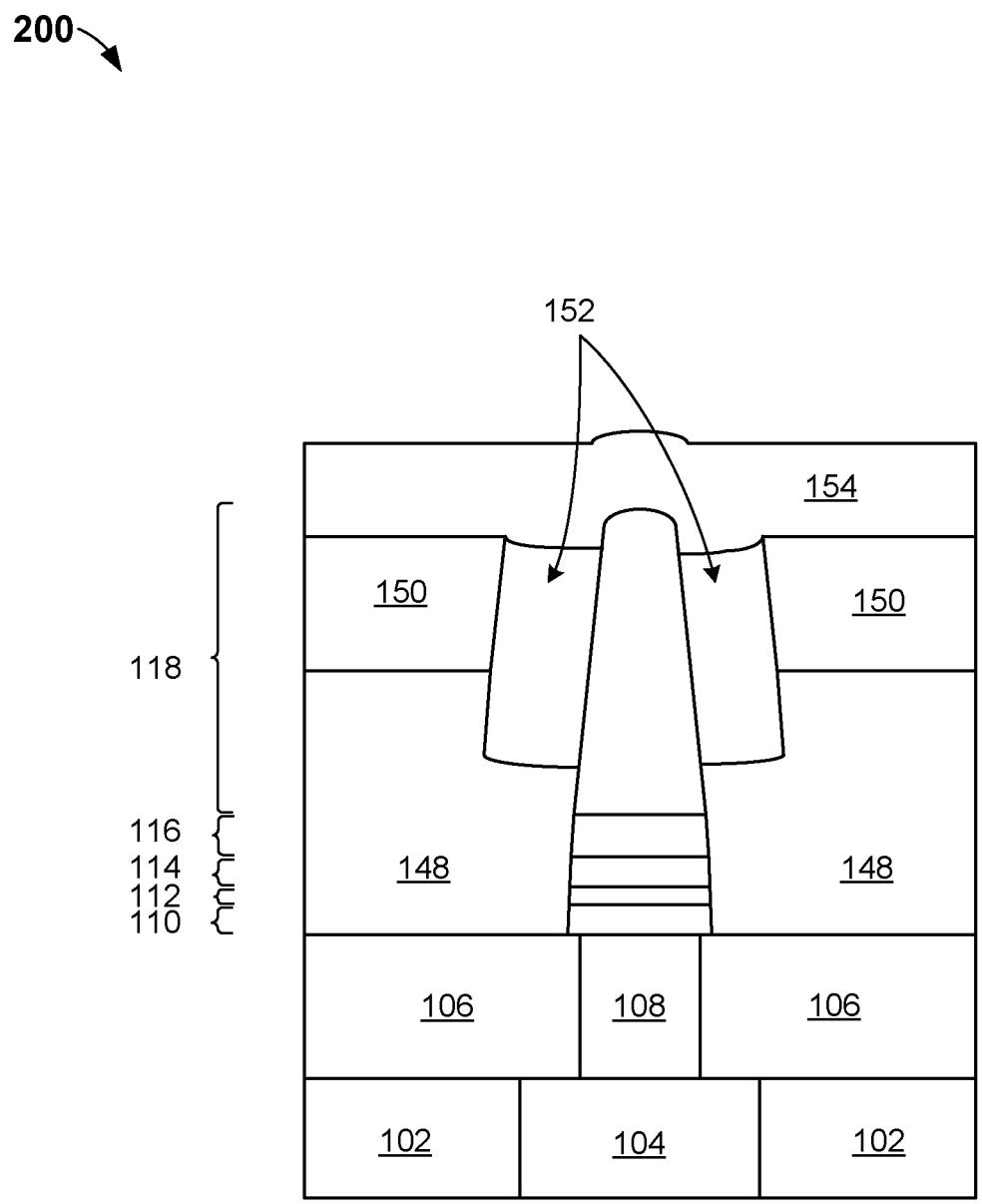
FIGS. 14 and 15 each illustrate forming an interlevel dielectric, according to two exemplary embodiments.
Figure 15:
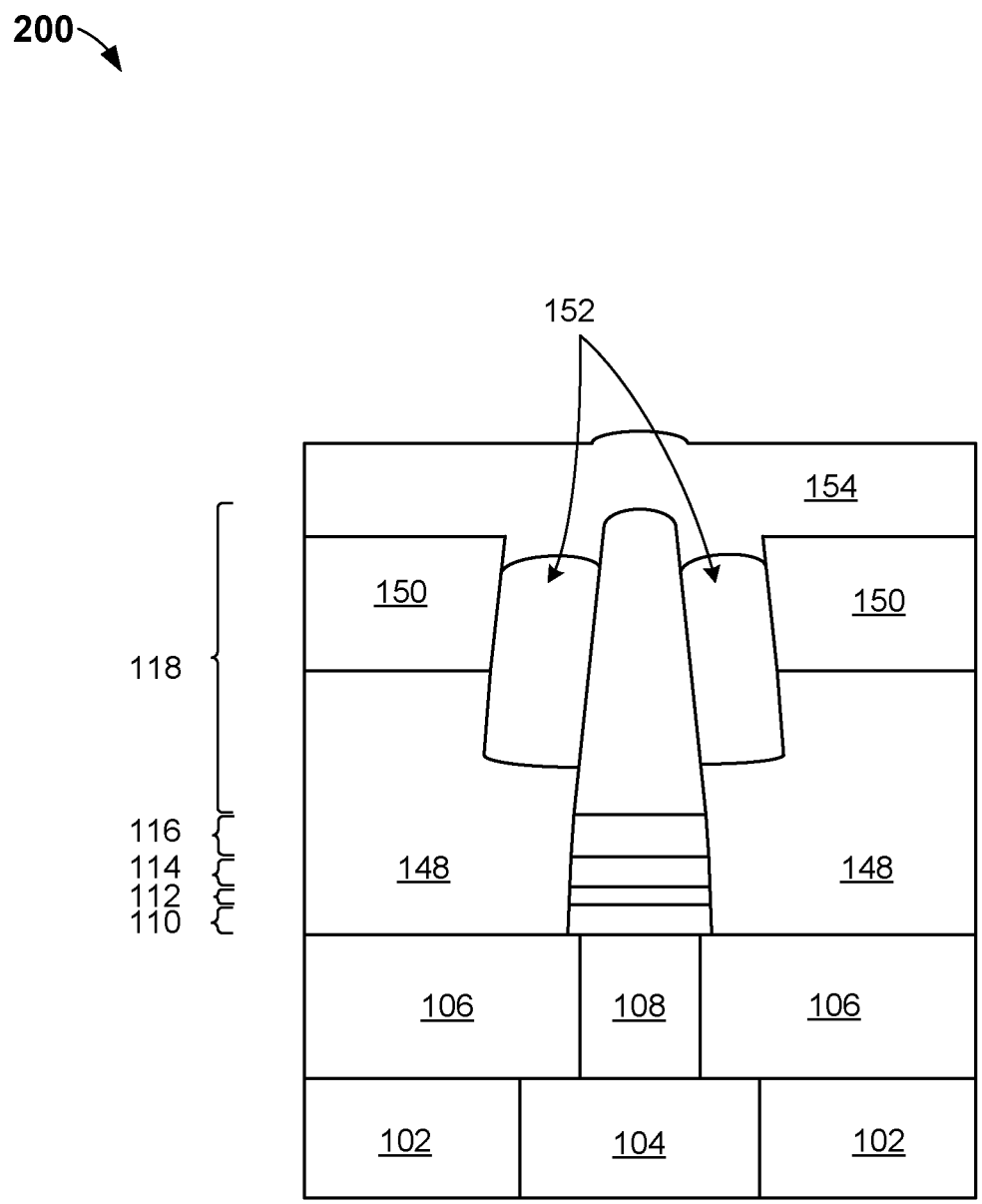

Referring now to FIGS. 14 and 15, the structure 200 is shown according to two exemplary embodiments. As shown in FIGS. 14 and 15, a third interlayer dielectric, (hereinafter "third ILD") 154 may be formed.

The third ILD 154 may be formed by CVD. The third ILD 154 may be composed of, for example, silicon oxide (SiOx), silicon nitride (SiNx), silicon boron carbonitride (SiBCN), NBLOK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

The third ILD 154 may partially fill an upper portion of the cavity 152. The third ILD 154 may cover the insulator 150. The third ILD 154 may cover an upper surface and a portion of outer sidewalls of the metallic hard mask 118. Deposition conditions (pressure, flow, temperature, power, etc.) of the third ILD 154 may be adjusted to avoid filling the cavity 152.

The cavity 152 remains surrounding the metallic hard mask 118. The cavity 152 provides thermal insulation of the MTJ and metallic hard mask 118 and the etch stop layer 116 above the MTJ, from the surrounding insulator 150 and the second sidewall dielectric 148.

As shown in FIG. 14, the third ILD 154 at the entrance of the cavity 152 forms a concave surface in an embodiment. As shown in FIG. 15, the third ILD 154 at the entrance of the cavity 152 forms a convex surface in an embodiment. These two different embodiments may be controlled by deposition conditions.

Figure 16:
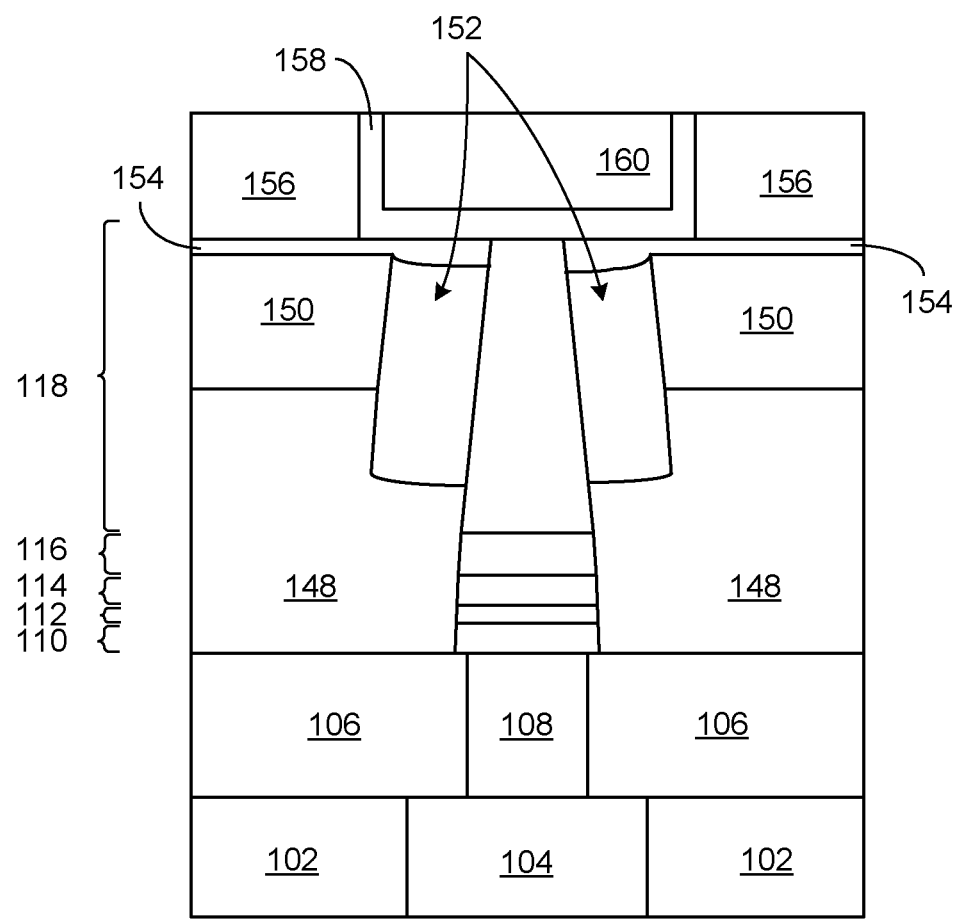
FIGS. 16 and 17 illustrates forming a bit line, according to two exemplary embodiments.
Figure 17:
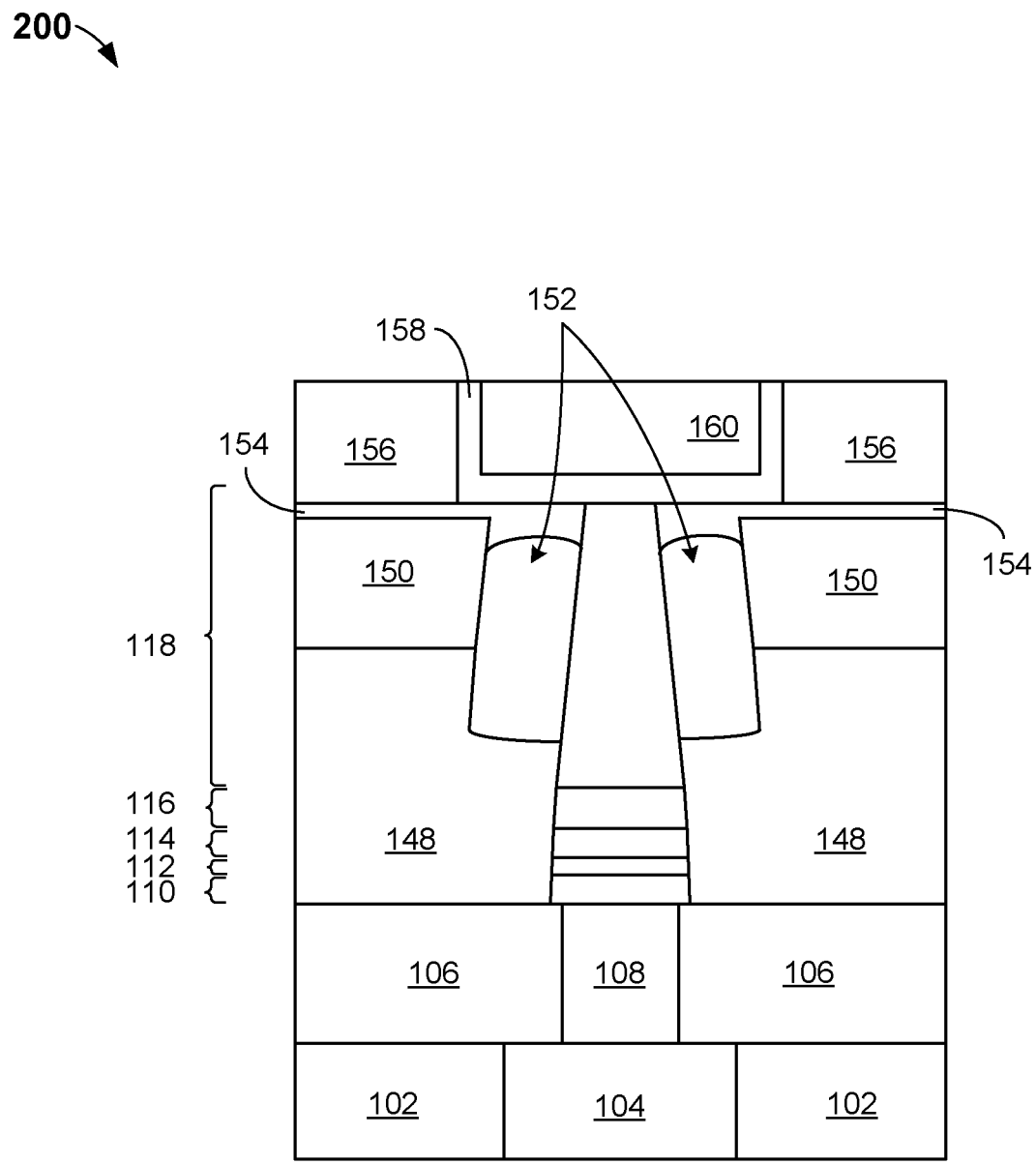

Referring now to FIGS. 16 and 17, the structure 200 is shown according to two exemplary embodiments. As shown in FIGS. 16 and 17, a CMP technique may be used to remove excess material and polish upper surfaces of the structure 200 such that upper horizontal surfaces of the third ILD 154 and the metallic hard mask 118 are coplanar. A fifth interlayer dielectric, (hereinafter "fifth ILD") 156, a liner 158 and a bit-line metal 160 may be formed. FIG. 16 may be formed from FIG. 14, and FIG. 17 may be formed from FIG. 15.

The fifth ILD 156 may be conformally formed on an upper surface of the structure 200, covering the third ILD 154 and the metallic hard mask 118.

The fifth ILD 156 may be formed by conformally depositing or growing a dielectric and performing an isotropic etch process. The fifth ILD 156 may include one or more layers. The fifth ILD 156 may be composed of, for example, silicon oxide (SiOx), silicon nitride (SiNx), silicon boron carbonitride (SiBCN), NBLOK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material. In an embodiment, the fifth ILD 156 may have two or more layers, where a lower most layer of the two or more layers may be used as etch stop for a subsequence dielectric etch to make contact, as described below.

A fourth opening (not shown) may be formed in the fifth ILD 156. The fourth opening (not shown) may align vertically with the MTJ stack. The fourth opening (not shown) may be formed via an etch selective to the fifth ILD 156 and the metallic hard mask 118.

The liner 158 may be formed along a lower surface and along vertical side surfaces of the fourth opening (not shown). The liner 158 may be formed after several processes, including for example, conformally depositing or growing a dielectric and performing an isotropic etch process. The liner 158 may include any dielectric material such as silicon nitride and may include a single layer or may include multiple layers of dielectric material.

The bit-line metal 160 may be deposited in a remaining portion of the fourth opening (not shown) using typical deposition techniques, for example, ALD, MLD and CVD. Materials for the bit-line metal 160 may include, but are not limited to, copper (Cu), tantalum nitride (TaN), tantalum (Ta), titanium (Ti), titanium nitride (TiN), or a combination thereof.

After forming the bit-line metal 160, a CMP technique may be used to remove excess material and polish upper surfaces of the structure 200 such that upper horizontal surfaces of the fifth ILD 156, the liner 158 and the bit-line metal 160 are coplanar.

The resulting structure 200 contains an air gap, the cavity 152, surrounding the metallic hard mask 118 above the MTJ stack layers, providing thermal isolation of the MTJ.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a magnetic tunnel junction stack;
   a metallic hard mask aligned above the magnetic tunnel junction stack;
   an air gap directly surrounding side surfaces of the metallic hard mask; and
   a dielectric surrounding side surfaces of the air gap and defining an upper surface of the air gap.

2. The semiconductor device according to claim 1, further comprising:
   a barrier disposed between the dielectric and the air gap.

3. The semiconductor device according to claim 2, wherein
   the barrier comprising tantalum nitride (TaN).

4. The semiconductor device according to claim 1, wherein
   the dielectric comprising silicon oxide.

5. The semiconductor device according to claim 1, wherein
   the dielectric comprising tetraethyl orthosilicate, Si(OC2H5)4 (TEOS).

6. A semiconductor device comprising:
   a magnetic tunnel junction stack; and
   a metallic hard mask aligned above the magnetic tunnel junction stack, wherein at least a portion of a sidewall of the metallic hard mask is exposed in an air gap, wherein an upper surface of the air gap is defined by a dielectric.

7. The semiconductor device according to claim 6, further comprising:

a barrier surrounding the air gap, wherein at least a portion of a sidewall of the barrier is exposed in the air gap.

8. The semiconductor device according to claim 7, wherein
the barrier comprising tantalum nitride (TaN).

9. The semiconductor device according to claim 7, further comprising: the dielectric surrounding sidewalls of the barrier.

10. The semiconductor device according to claim 9, wherein
the dielectric comprising silicon oxide.

11. The semiconductor device according to claim 9, wherein
the dielectric comprising tetraethyl orthosilicate, Si(OC2H5)4 (TEOS).

12. A semiconductor device comprising:
a magnetic tunnel junction stack;
a metallic hard mask above and vertically aligned with the magnetic tunnel junction stack;
an air gap surrounding the metallic hard mask, wherein the metallic hard mask and a barrier each define opposite sidewalls of the air gap and a dielectric defining an upper surface of the air gap.

13. The semiconductor device according to claim 12, wherein
the barrier comprising tantalum nitride (TaN).

14. The semiconductor device according to claim 13, further comprising: the dielectric surrounding the barrier.

15. The semiconductor device according to claim 14, wherein
the dielectric comprising silicon oxide.

16. The semiconductor device according to claim 14, wherein
the dielectric comprising tetraethyl orthosilicate, Si(OC2H5)4 (TEOS).

* * * * *